US006777778B2

(12) United States Patent
Sato

(10) Patent No.: US 6,777,778 B2
(45) Date of Patent: Aug. 17, 2004

(54) THIN-FILM RESISTOR AND METHOD FOR MANUFACTURING THE SAME

(75) Inventor: Kiyoshi Sato, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 10/171,144

(22) Filed: Jun. 13, 2002

(65) Prior Publication Data

US 2002/0197811 A1 Dec. 26, 2002

(30) Foreign Application Priority Data

Jun. 20, 2001 (JP) ....................................... 2001-186920

(51) Int. Cl.[7] ............................................... H01L 27/02

(52) U.S. Cl. ........................ 257/536; 257/308; 338/308

(58) Field of Search ................................ 257/536, 358; 338/308

(56) References Cited

U.S. PATENT DOCUMENTS

| | | | | | |
|---|---|---|---|---|---|
| 3,790,913 | A | * | 2/1974 | Peters et al. | 338/308 |
| 3,854,965 | A | * | 12/1974 | Niwa et al. | 501/153 |
| 3,876,912 | A | * | 4/1975 | Sanders | 361/765 |
| 4,000,054 | A | * | 12/1976 | Marcantonio | 204/192.17 |
| 4,105,892 | A | * | 8/1978 | Tashiro et al. | 219/216 |
| 4,485,370 | A | * | 11/1984 | Poisel | 338/309 |
| 4,609,903 | A | * | 9/1986 | Toyokura et al. | 338/22 SD |
| 4,684,916 | A | * | 8/1987 | Ozawa | 338/308 |
| 4,710,263 | A | * | 12/1987 | Kato | 216/27 |
| 4,760,369 | A | * | 7/1988 | Tiku | 338/308 |
| 4,772,520 | A | * | 9/1988 | Takeno et al. | 428/698 |
| 4,963,389 | A | * | 10/1990 | Takada et al. | 427/98 |
| 5,189,284 | A | * | 2/1993 | Takahashi et al. | 219/543 |
| 5,633,035 | A | * | 5/1997 | Baba et al. | 427/101 |
| 5,685,968 | A | * | 11/1997 | Hayakawa et al. | 205/122 |
| 5,821,960 | A | * | 10/1998 | Mitani | 347/58 |
| 5,994,996 | A | * | 11/1999 | Van Den Broek et al. | 338/308 |
| 6,013,940 | A | * | 1/2000 | Harada et al. | 257/538 |
| 6,365,483 | B1 | * | 4/2002 | Lin et al. | 438/384 |
| 2002/0030577 | A1 | * | 3/2002 | Shibuya et al. | 338/308 |
| 2002/0031860 | A1 | * | 3/2002 | Tanimura | 438/108 |

FOREIGN PATENT DOCUMENTS

| | | | |
|---|---|---|---|
| JP | 54-126049 | * | 9/1979 |
| JP | 56-38806 | * | 4/1981 |
| JP | 56-99680 | * | 8/1981 |
| JP | 63-237458 | * | 10/1988 |
| JP | 1-97666 | * | 4/1989 |
| JP | 1-216502 | * | 8/1989 |
| JP | 2-265207 | * | 10/1990 |
| JP | 3-199057 | * | 8/1991 |
| JP | 5-175428 | * | 7/1993 |
| JP | 2707717 | | 10/1997 |
| JP | 10-50502 | * | 2/1998 |
| JP | 2864569 | | 12/1998 |
| JP | 2001-168264 | | 6/2001 |

* cited by examiner

*Primary Examiner*—Nathan J. Flynn
*Assistant Examiner*—Ahmed N. Sefer
(74) *Attorney, Agent, or Firm*—Brinks Hofer Gilson & Lione

(57) ABSTRACT

A thin-film resistor includes a resistive element with a predetermined length and width deposited on a substrate. An insulator layer is patterned so as to cover all of the resistive element except the ends in the width direction and is tapered. Electrodes are connected to respective ends of the resistive element via a plating base layer. The electrodes have a reduced resistance. The thin-film resistor can exhibit high accuracy and a small range of variation of the resistance.

4 Claims, 5 Drawing Sheets

THIN-FILM RESISTOR AND METHOD FOR MANUFACTURING THE SAME

BACKGROUND OF THE INVENTION

1. Field of the Invention

The present invention relates to a thin-film resistor used for various miniature electronic circuits and to a method for manufacturing the resistor.

2. Description of the Related Art

FIG. 7 is a plan view of a known thin-film resistor, FIG. 8 is a sectional view of the thin-film resistor, and FIGS. 9A to 9D are schematic drawings showing a process of the thin-film resistor. As shown in FIGS. 7 and 8, the known thin-film resistor comprises a resistive element 11 and a pair of electrodes 12 disposed on an alumina substrate 10. The resistance of the thin-film resistor is defined by the length L and the width W of the resistive element 11 between the electrodes 12.

In order to prepare the thin-film resistor having the above-described structure, first, TaN for the resistive element 11 and Al for the electrodes 12 are formed into films, in that order, on the alumina substrate 10 by vapor deposition, ion beam sputtering, or the like, as shown in FIG. 9A. Then the films are patterned into predetermined shapes by etching, ion milling, or the like. Next, as shown in FIG. 9B, the Al is covered with a photoresist by spin coating, and is subsequently exposed to light to form a resist pattern 13 having a predetermined shape. The Al exposed at the resist pattern 13 is subjected to wet etching, as shown in FIG. 9C. Thus, the thin-film resistor having the resistive element 11 between the electrodes 12 is completed, as shown in FIG. 9D.

The resistance of the electrodes 12 must be reduced in known thin-film resistors. However, the electrodes 12 are formed of an electrode material, such as Al, to a small thickness of about 100 to 500 nm by vapor deposition, ion beam sputtering, or the like, and therefore, it is difficult to sufficiently increase the thickness of the electrodes 12 and, consequently, to reduce the resistance. Also, patterning the electrode material by wet-etching to form the electrodes 12 causes a large amount of side etch in edges of the electrodes 12, as shown in FIG. 9C. As a result, the length L of the resistive element 11 between the electrodes 12 varies and thus the precision of the resistance is degraded. Instead of forming the single-layer Al electrodes, Cr/Cu, Cr/Cu/Cr, Cr/Au, Cr/Au/Cr, and the like can be used to form two-layer or three-layer electrodes. This multilayer structure causes stepped side etch in edges of the electrodes because the plurality of layers are subjected to wet etching to pattern the electrodes, thereby degrading the precision of the resistance, as in the single-layer electrodes.

SUMMARY OF THE INVENTION

Accordingly, an object of the present invention is to provide an accurate thin-film resistor which includes electrodes having a reduced resistance and which exhibits only a small range of variation in resistance.

To this end, according to one aspect of the present invention, a thin-film resistor is provided. The thin-film resistor has a substrate, a resistive element deposited on the substrate, and a tapered insulator layer patterned so as to cross over the resistive element in the width direction. A plating base layer is formed on the resistive element and the insulator layer and is divided into a pair of portions on the insulator layer such that the gap between the portions extends across the width of the resistive element. A pair of electrodes is formed on the surfaces of the pair of portions.

The present invention is also directed to a method for manufacturing a thin-film resistor including the steps of: depositing a resistive element having a predetermined length and width on a substrate; forming an insulating resist pattern defining an insulator layer on the substrate so as to cover all of the resistive element except the ends in the longitudinal direction of the resistive element; tapering the insulating resist pattern to form the insulator layer; forming a plating base layer on the substrate by plating to cover the resistive element and the insulator layer; forming a pair of electrodes on the surface of the plating base layer by plating such that the gap between the electrodes extends across the width of the resistive element; and removing the plating base layer between the electrodes.

By forming the electrodes to large thickness by plating, the resistance of the electrodes can be reduced. Also, since the resistance of the thin-film resistor is defined by the shape of the insulating resist pattern of the insulator layer, the resulting thin-film resistor can have high accuracy and a small range of variation of the resistance.

In the method for manufacturing the thin-film resistor, the step of tapering the insulating resist pattern may include a sub step of post-baking the insulating resist pattern and subsequently curing the insulating resist pattern. Preferably, after post baking, the insulating resist pattern is exposed to ultraviolet light and is then cured. By being exposed to ultraviolet light, the original shape of the tapered insulating resist pattern formed by post baking can be maintained even after curing.

DESCRIPTION OF THE PREFERRED EMBODIMENTS

Figure 1:
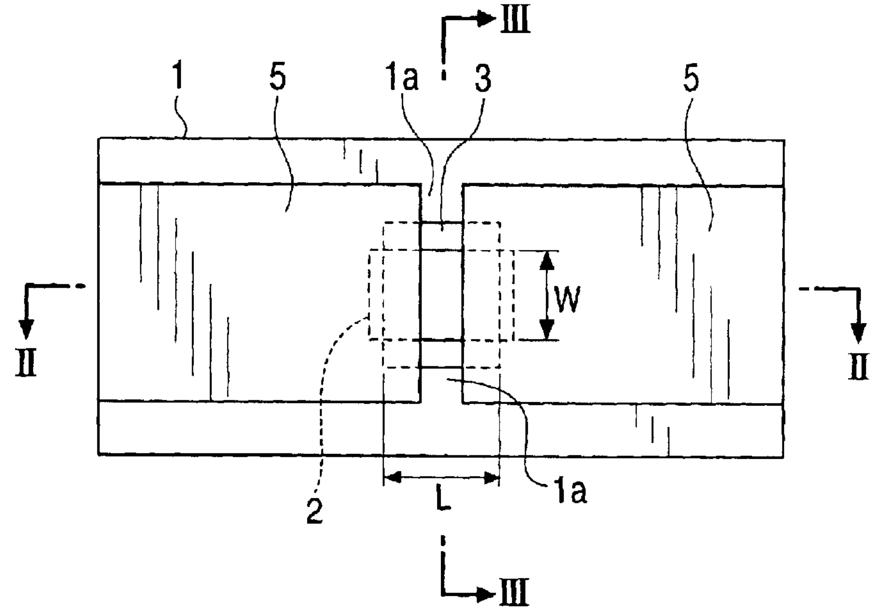
FIG. 1 is a plan view of a thin-film resistor according to an embodiment of the present invention.
Figure 2:
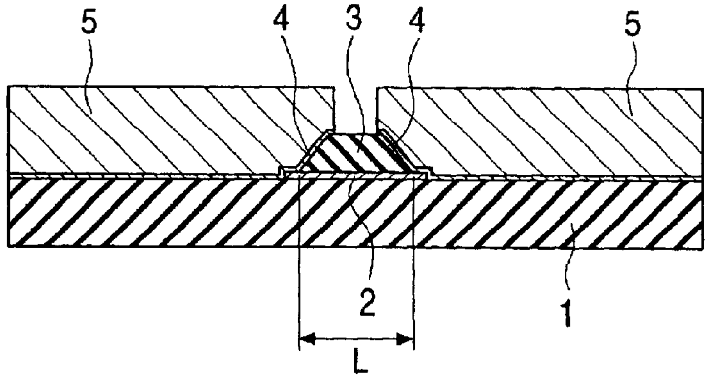
FIG. 2 is a sectional view taken along line II—II in FIG. 1.
Figure 3:
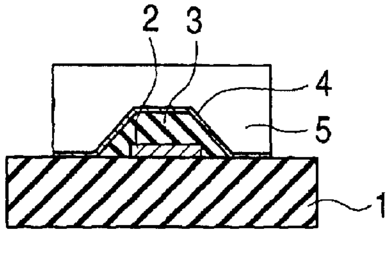
FIG. 3 is a sectional view taken along line III—III in FIG. 1.
Figure 4A:
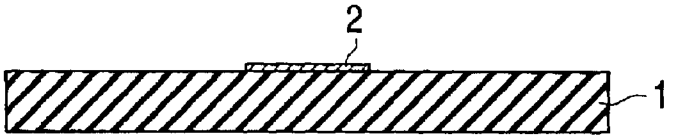
FIGS. 4A to 4F are schematic drawings showing a process of the thin-film resistor.
Figure 4B:
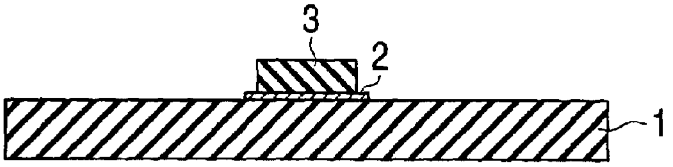
Figure 4C:
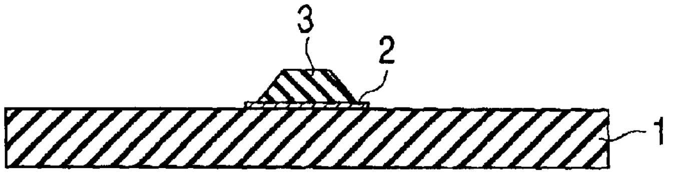
Figure 5:
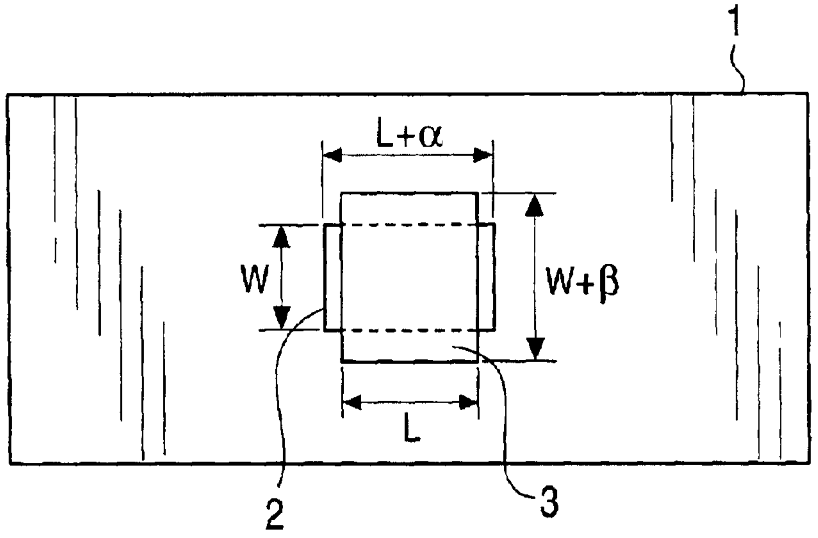
FIG. 5 is a schematic drawing showing a step of the process of the thin-film resistor.
Figure 6:
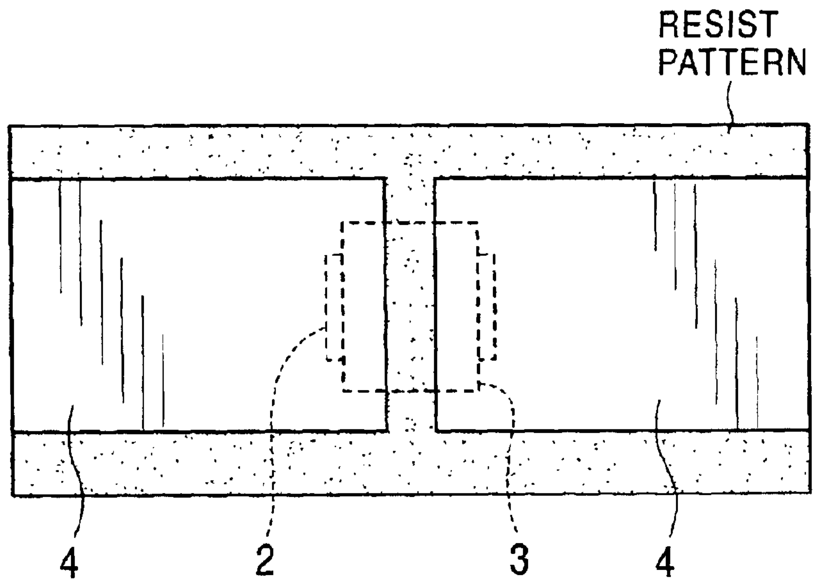
FIG. 6 is a schematic drawing showing a step of the process of the thin-film resistor.
Figure 7:
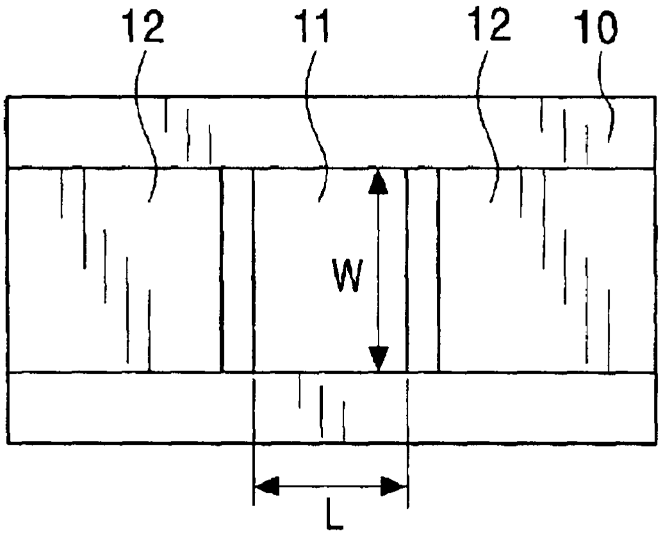
FIG. 7 PRIOR ART
FIG. 7 is a plan view of a known thin-film resistor.
Figure 8:
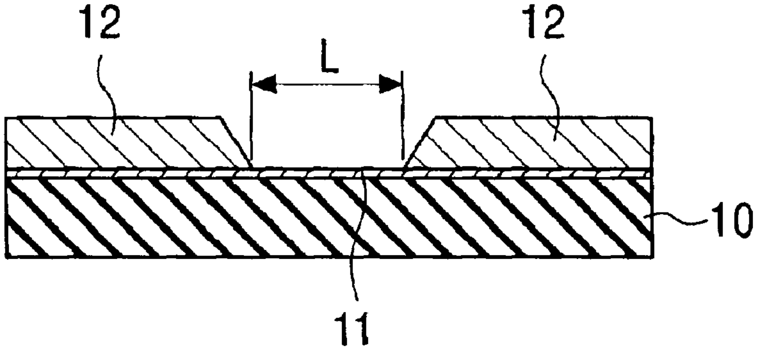
FIG. 8 PRIOR ART
FIG. 8 is a sectional view of the known thin-film resistor.
Figure 9A:
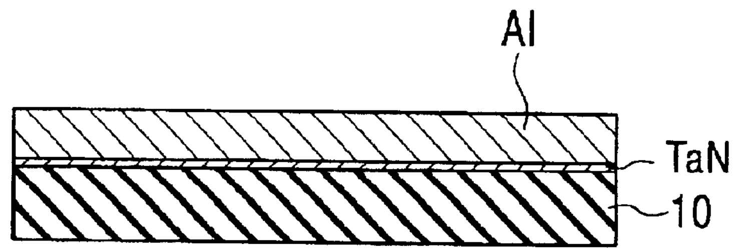
FIG. 9A PRIOR ART
FIGS. 9A to 9D are schematic drawings showing a process for manufacturing the known thin-film resistor.
Figure 9B:
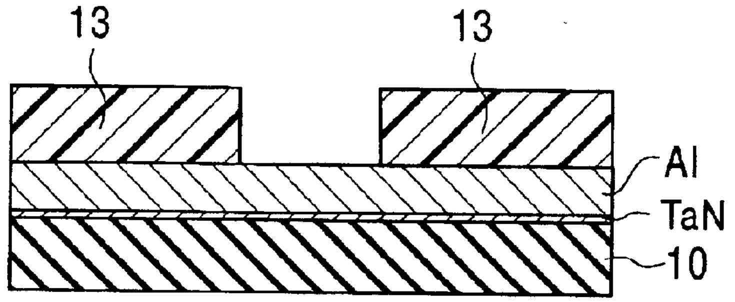
FIG. 9B PRIOR ART
Figure 9C:
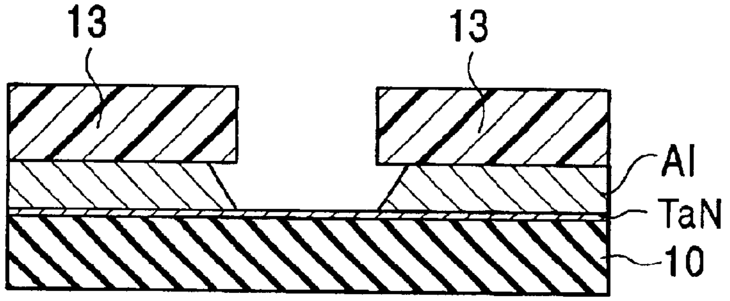
FIG. 9C PRIOR ART
Figure 9D:
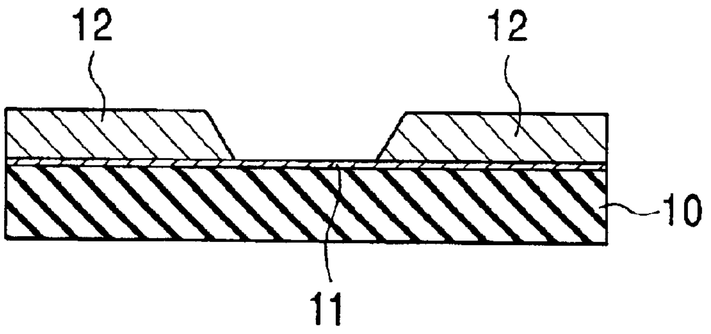
FIG. 9D PRIOR ART

An embodiment will be described with reference to drawings. FIG. 1 is a plan view of a thin-film resistor according to an embodiment of the present invention. FIGS. 2 and 3 are sectional views taken along line II—II and line III—III in FIG. 1, respectively. FIGS. 4A to 4D show a process of the thin-film resistor. FIGS. 5 and 6 are plan views showing steps in the process and correspond to FIG. 4B and FIG. 4E, respectively.

As shown in FIGS. 1 to 3, the thin-film resistor according to the embodiment includes a substrate 1, a resistive element 2 formed on the substrate 1, an insulator layer 3 patterned so as to cross over the resistive element 2 in the width direction, a plating base layers 4 divided into a pair of portions formed on the resistive element 2 and the insulator layer 3, and a pair of electrodes 5 formed on the surfaces of the pair of portions of the plating base layer 4 by plating. The insulator layer 3 is tapered. The pair of electrodes 5 is separated such that the gap between the electrodes 5 extends across the width of the resistive element 2. The electrodes 5 are connected to respective sides in the longitudinal direction of the resistive element 2 via the plating base layer 4. The resistance of the thin-film resistor is defined by the length L in the longitudinal direction of the under surface of the insulator layer 3 and the length W in the width direction of the resistive element 2.

The substrate 1 is formed of glazed-alumina or non-glazed alumina. The resistive element 2 is formed of a resistive material, such as TaN, NiCr, TaSi, and TaSiO. When the resistive material has a low specific resistance like TaN, preferably, a glazed alumina substrate (a sintered alumina substrate with a purity of 96% coated with glass) is used. When the resistive material has a high specific resistance like TaSiO, a non-glazed alumina substrate (for example, 99.5%-or 99.7%-alumina substrate) may be used.

The insulator layer 3 is formed to cover all of the resistive element 2 except the ends in the longitudinal direction. The insulator layer 3 is tapered so that the cross section thereof is substantially trapezoidal. In order to form the insulator layer 3, for example, a positive photoresist is exposed and developed to form an insulating resist pattern having a desired shape. The insulating resist pattern is post-baked at a temperature of 110 to 180° C. to be tapered, and is then cured in an atmosphere of nitrogen gas at a temperature of 220 to 260° C. Thus, the insulator layer is formed. Alternatively, after post baking, the resist pattern may be exposed to ultraviolet light and then cured at a temperature of 220 to 250° C. This method is preferable as it maintains the original shape of the tapered insulator layer 3.

The plating base layer 4 is formed with a plurality of metal layers of Cr/Cu, Ti/Cu, Cr/Au, Ti/Au, or the like by sputtering, vapor deposition, ion beam sputtering, or the like. In this instance, preferably, the thickness of Cr or Ti, which is a lower layer of the plating base layer 4 serving as an adhesion layer, is in the range of 5 to 50 nm. The thickness of Cu or Au, which is an upper layer, is in the range of 50 to 200 nm.

The electrodes 5 are formed of Cu, Au, Cu/Ni, Cu/Ni—P, or the like by electrolytically plating the surface of the plating base layer 4. Plating provides the electrodes 5 with sufficient thickness. Preferably, the thickness of the electrodes 5 is in the range of about 500 nm to 5 $\mu$m. This thickness leads to a reduced resistance of the electrodes 5. In order to separate the electrodes 5 such that the gap therebetween extends across the width of the insulator layer 3, the plating base layer 4 and the electrodes 5 are formed such that they have the same shape in plan view. In this instance, a resist pattern is formed on regions of the plating base layer 4 where the electrodes 5 are not to be formed, and then the surface of the plating base layer 4 is electrolytically plated with an electrode material. The resist pattern is then removed to complete the electrodes 5 having a desired shape. After the removal of the resist pattern, the region of the plating base layer 4 which was covered with the resist pattern is removed by ion milling to form the plating base layer 4 having the same shape in plan view as that of the electrodes 5. Since the insulator layer 3 is tapered, the plating base layer 4 is completely removed from the substrate 1 at both sides in the width direction of the insulator layer 3 (from the regions designated by reference numeral 1*a* in FIG. 1). Thus, short circuiting between the pair of electrodes 5 can be prevented. Also, since the insulator layer 3 is tapered, the plating base layer 4 can be formed substantially uniformly on the sloped periphery of the insulator layer 3, as shown in FIG. 2. Thus, the electrodes 5 on the plating base layer 4 can be made with high accuracy and with no defects.

A method for manufacturing the thin-film resistor will now be described with reference to FIGS. 4A to 6.

First, in the step of forming a resistive element, TaN material, as a resistive material, is deposited to a thickness of 10 to 100 nm on the substrate 1, which may be a non-glazed or a glazed-alumina substrate, by vapor deposition, ion beam sputtering, or the like, and subsequently a positive photoresist is applied on the resistive material by spin coating. Then, the photoresist is subjected to exposure and development to form a resist pattern having a desired shape and to expose the resistive material at the resist pattern. The resistive material exposed at the resist pattern is removed by wet etching, reactive ion etching (RIE), ion milling, or the like, and then the resist pattern is removed. Thus, the resistive element 2 having a desired shape on the substrate 1 is formed, as shown in FIG. 4A.

Next, in the step of forming an insulating resist pattern defining the insulator layer 3, the resistive element 2 is covered with a positive photoresist by spin coating. As shown in FIG. 4B, the photoresist is subjected to exposure and development to form an insulating resist pattern having a desired shape, which results in the insulator layer 3 in the following step. The resist pattern has a thickness of 500 nm to 3 $\mu$m across the width of the resistive element 2. As shown in FIG. 5, the resulting insulator layer 3 has a length L smaller than the entire length $L+\alpha$ of the resistive element 2 and a width $W+\beta$ larger than the width W of the resistive element 2. The shape of the insulating resist pattern accurately defines the resistance of the thin-film resistor. Specifically, the resistance of the thin-film resistor is defined by the thickness, the width W, and the length L of the region of the resistive element 2 covered with the insulator layer 3. The thickness and the width W can be set accurately by patterning the resistive material and the length L can be defined accurately by the shape of the insulating resist pattern.

Next, in the step for tapering the insulating resist pattern, the resist pattern is post-baked at a temperature of 110 to 180° C. and is subsequently exposed to ultraviolet light to harden the surface thereof. Then, the insulator layer 3 is cured at a temperature of 220 to 250° C., so that the resist pattern is tapered, as shown in FIG. 4C, and thus the insulator layer 3 is formed. In the tapering step, an oxide layer is formed on the surface of both ends of the resistive element 2, which are not covered with the insulator layer 3. Preferably, this surface oxide layer is removed by milling or by counter sputtering.

Figure 4D:
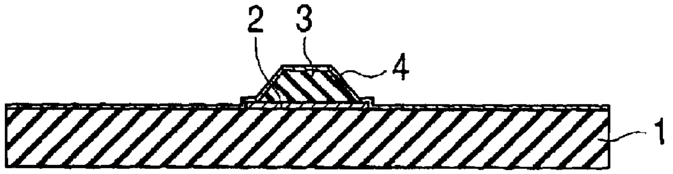

Next, in the step of forming a plating base layer, for example, Cr and Cu are deposited in that order by sputtering, vapor deposition, ion beam sputtering, or the like to cover the resistive element 2 and the insulator layer 3, thus forming in the plating under layer 4 as shown in FIG. 4D.

Figure 4E:
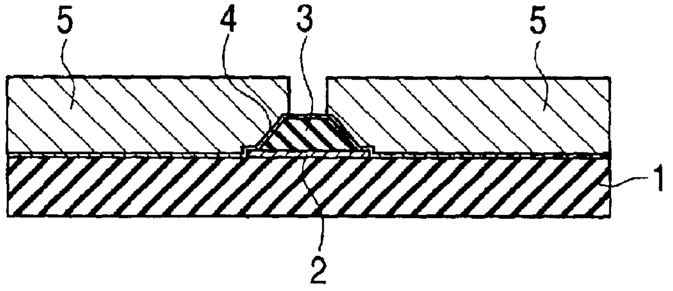

Next, in the step of forming electrodes, a positive photoresist is applied by spin coating to cover the plating base layer 4. The photoresist is subjected to exposure and development to form a resist pattern having a desired shape in the region of the plating base layer 4 where the electrodes are not formed. Then, the surface of the plating base layer 4 exposed at the resist pattern is electrolytically plated with Cu to form the pair of electrodes 5 having a sufficient thickness of 0.5 to 5 nm, as shown in FIG. 4E. In this instance, the resist pattern is formed in the shaded region in FIG. 6. After completing the electrodes 5, the resist pattern is removed to expose the plating base layer 4.

Figure 4F:
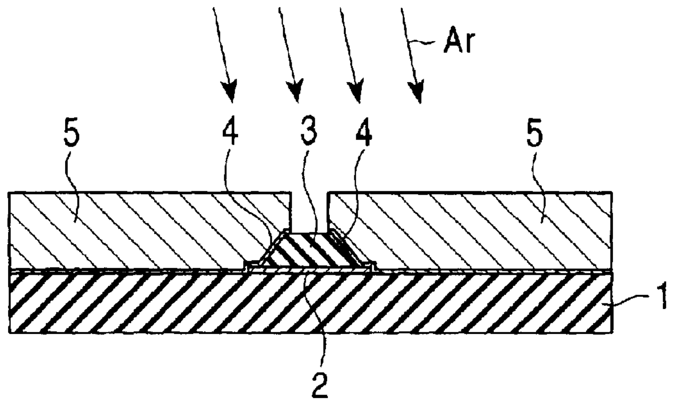

Finally, in the step of removing the plating base layer 4, Ar ions are applied at an incident angle of 0° to 30° by ion milling, as shown in FIG. 4F, to remove the plating base layer 4 (shaded region in FIG. 6) exposed by the removal of the resist pattern in the step of forming the electrodes. As a result, the plating base layer 4 having the same shape as that of both electrodes 5 in plan view is completed. The electrodes 5 are connected to respective ends in the longitudinal direction of the resistive element 2 via the plating base layer 4. In this step, since the insulator layer 3 is tapered, the plating base layer 4 formed on the surface of the insulator layer 3 is reliably removed without being reattached against the incident angle of the ions. When the plating base layer 4 is completely removed by ion milling, the surface of the insulator layer 3 underlying the plating base layer 4 is also slightly removed. However, the insulator layer 3 has sufficient thickness, and therefore, the resistive element 2, which is the undermost layer, is not subjected to the ion milling.

As described above, in the thin-film resistor according to the embodiment, by forming the electrodes 5 with a large thickness by plating, the resistance of the electrodes 5 can be reduced. Also, since the resistance is defined by the insulating resist pattern for forming the insulator layer 3, the variation of the resistance can be reduced. Therefore, a highly accurate thin-film resistor having a reduced variation of the resistance can be achieved.

What is claimed is:

1. A thin-film resistor comprising:

a substrate;

a resistive element deposited on the substrate;

an insulator layer patterned so as to cross over the resistive element in a width direction, a resistance of the thin-film resistor being defined by a length in a longitudinal direction of an under surface of the insulator layer, the insulator layer being tapered;

a plating base layer formed on the resistive element and the insulator layer, the plating base layer being divided into a pair of portions on the insulator layer such that a gap between the portions extends across a width of the resistive element; and a pair of electrodes formed on surfaces of the pair of portions, wherein the substrate comprises non-glazed alumina, and the resistive element comprises TaSiO.

2. A thin-film resistor comprising:

a substrate;

a resistive element deposited on the substrate;

an insulator layer patterned so as to cross over the resistive element in a width direction, a resistance of the thin-film resistor being defined by a length in a longitudinal direction of an under surface of the insulator layer, the insulator layer being tapered;

a plating base layer formed on the resistive element and the insulator layer, the plating base aver being divided into a pair of portions on the insulator layer such that a gap between the portions extends across a width of the resistive element; and a pair of electrodes formed on surfaces of the pair of portions, wherein the plating base layer comprises any one of Cr/Cu, Ti/Cu, Cr/Au, or Ti/Au Cr or Ti being a lower layer of the plating layer, and Cu or Au being an upper layer of the plating base layer.

3. The thin film resistor according to claim 2, wherein the substrate comprises glazed alumina, and the resistive element comprises any one of TaN, NiCr, or TaSi.

4. The thin film resistor according to claim 2, wherein the pair of electrodes are films comprising any one of Cu, Au, or Cu/Ni.

* * * * *